United States Patent [19]

Sawai

[11] 3,716,852

[45] Feb. 13, 1973

[54] CODE CONVERSION CIRCUIT FOR A TWO-LEVEL TO MULTI-LEVEL CODE CONVERTER

[75] Inventor: Akira Sawai, Tokyo, Japan

[73] Assignee: Nippon Electric Company, Limited, Tokyo, Japan

[22] Filed: Feb. 25, 1972

[21] Appl. No.: 118,671

[30] Foreign Application Priority Data

March 5, 1970 Japan ................................45/19174

[52] U.S. Cl............................340/347 DD, 325/38 A

[51] Int. Cl..............................................H03k 13/24

[58] Field of Search..............340/347 DD; 325/38 A; 179/15 AV, 15 BC

[56] References Cited

UNITED STATES PATENTS

| | | | |
|---|---|---|---|
| 3,030,614 | 4/1967 | Lehan et al. | 179/15 BC X |
| 3,133,280 | 5/1964 | Crater | 340/347 DD |
| 3,214,749 | 10/1965 | Karnaugh | 340/347 DD |
| 3,394,224 | 7/1968 | Helm | 179/15 BC X |
| 3,419,805 | 12/1968 | Melas | 325/38 A |
| 3,518,662 | 6/1970 | Nakagome et al. | 340/347 DD |

*Primary Examiner*—Charles D. Miller

*Attorney*—Sandoe, Hopgood & Calimafde

[57] ABSTRACT

A two-level to multi-level code converter includes a first portion for determining which pattern of *n*-digit two-level code inputs has the greatest occurrence frequency, and a second portion for converting the input codes to *n*-digit output codes in response to the outputs of the determining portion so that the frequency of occurrence of the two-level code corresponding to the maximum level of the multi-level code is the highest of the two-level output codes.

2 Claims, 5 Drawing Figures

INVENTOR
AKIRA SAWAI
by
Sandoe, Hopgood & Calimafde
ATTORNEYS

INVENTOR
AKIRA SAWAI
by
Sandoe, Hopgood & Calimafde
ATTORNEYS

CODE CONVERSION CIRCUIT FOR A TWO-LEVEL TO MULTI-LEVEL CODE CONVERTER

This invention relates generally to code conversion and more particularly to a circuit for converting a set of two-level codes to another set of two-level codes which are further converted to a set of multilevel code outputs in a two-level to multilevel code converter, whereby the occurrence frequency of a particular multilevel code with a particular level (for example, the maximum level) is the highest of the multilevel codes.

In the prior art two-level to multilevel code conversion is performed according to a fixed logical connection. An example of such code conversion is described in "Feedback Balanced Code for Multilevel PCM Transmission" by H. Kaneko and A. Sawai published in the IEEE Transaction on Communication Technique, Vol. COM-15, No. 5, pp. 554 ~ 563, particularly in FIG. 8 on page 561 thereof. In the application of code conversion in a PCM transmission, system, it is sometimes desirable that a particular multilevel code with a particular level have the highest occurrence frequency, in view of, for example, the effective use of repeater output power, the extraction of timing information necessary for pulse regeneration, and the function of automatic gain control. Further, a high occurrence frequency of the maximum level multilevel code is significant for improving code balancing of the partially controlled code among the feedback balanced code.

An object of this invention, therefore, is to provide a code conversion circuit connected to a two-level to multilevel code converter, for converting a set of two-level code inputs to another set of two-level codes which are further converted to a set of multilevel code outputs in a two-level to multilevel code converter, whereby the occurrence frequency of a particular multilevel code with a particular level is the highest among the multilevel codes.

The circuitry of this invention comprises two basic portions, one which determines, by examining each of *n* two-level code inputs where (*n* is a positive integer), whose pattern of all $2^n$ possible patterns of *n*-digit two-level code inputs has the highest occurrence frequency in a given time interval. The other portion converts the *n*-digit two-level input codes to *n*-digit two-level output codes in response to the outputs of the determining portion so that the occurrence frequency of a particular two-level code corresponding to the maximum level ("the maximum level" will hereinafter be referred to in place of "a particular level," without sacrificing the generality of the argument) among the multilevel codes is the highest of the two-level output codes. Although it is possible, in principle, to first perform two-level to multilevel code conversion and then perform a code conversion corresponding to the above-mentioned objective, such an approach leads to an undesirable complexity of circuitry. This invention therefore employs a method of performing code conversion directly on two-level code inputs.

The invention will now be described with reference to the accompanying drawings wherein.

Figure 1:
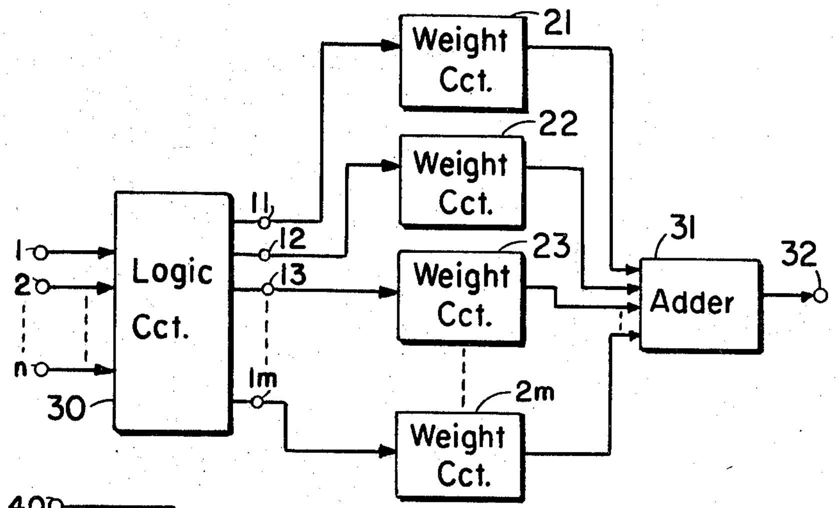
FIG. 1 is a schematic diagram in block form of conventional two-level to multilevel code converter.

Referring to FIG. 1, input terminals 1, 2, . . . , *n* are supplied with a set of two-level code inputs, which are converted by a logic circuit 30 into one of *m* (where *m* is an integer not smaller than $2^n$) combinations of two-level signals that appear at terminals 11, 12, . . . , 1*m*. If the two-level inputs correspond to level "1," a mark will appear at terminal 11 and spaces will appear at the other terminals at the output of circuit 30. If the two-level inputs correspond to level "2," a mark will appear only at terminal 12, and spaces at the other terminals, and so on. These *m* outputs are respectively applied to weighting circuits 21, 22, . . . , **2*m*, the outputs of which are summed up by an adder 31 to produce a multilevel output signal at terminal 32**.

Figure 2:
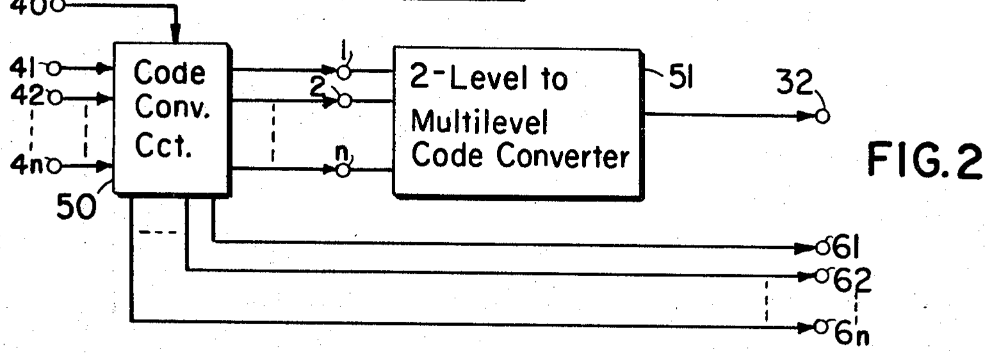
FIG. 2 shows a two-level to multilevel code converter in which a code conversion circuit of this invention is employed.

Referring to FIG. 2, converter 51 is considered to be identical to the two-level to multilevel code converter of FIG. 1. More precisely, terminals 1, 2, . . . , *n* and 32 of FIG. 2 are identical to terminals 1, 2, . . . , *n* and 32 of FIG. 1, and the remaining portion of the converter of FIG. 1 corresponds to code converter 51 of FIG. 2. Circuit 50 of FIG. 2 represents a code conversion circuit of this invention, to which *n* two-level inputs are applied via terminals 41, 42, . . . , 4*n*, and after undergoing code conversion, are taken out from terminals 1, 2, . . . , *n* again in the form of a group of *n* two-level signals. Terminals 40, 61, 62, . . . 6*n* will be described in a latter portion of the application.

The case of *n*=2 will be explained first, since the structure of circuit 50 for general *n*, including *n*=1, can readily be attained by expanding the structure for *n*=2.

Figure 3:
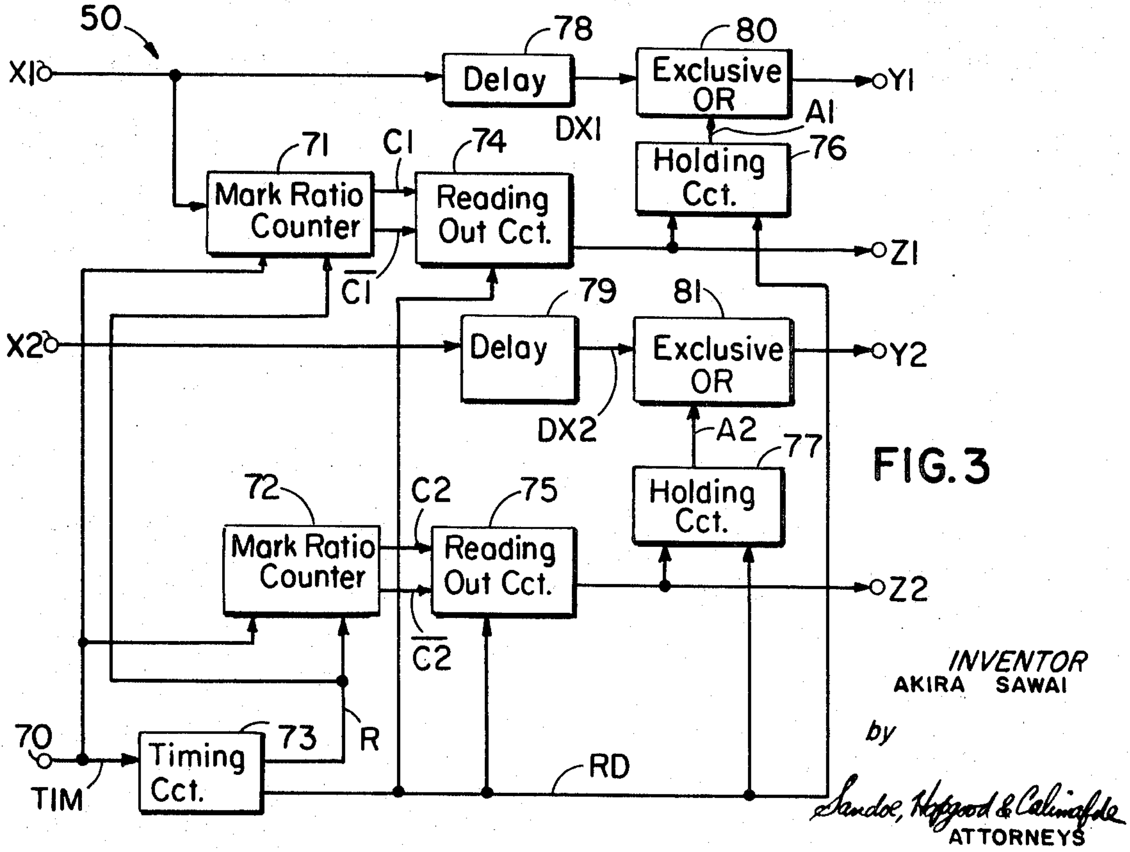
FIG. 3 is a schematic diagram in block form of an embodiment of the code conversion circuit of this invention, FIGS. 4 (*a*) and (*b*) are code tables for explaining the operation of the embodiment of FIG. 3.

FIG. 3 illustrates the structure of circuit 50 according to an embodiment of this invention, for *n*=2. Two two-level inputs are applied at terminals X1 and X2. Two mark-ratio counters 71 and 72 count the number of "marks" in the two-level inputs from the terminals X1 and X2, respectively. These counters start counting as soon as they are reset by a reset pulse R which is generated by a timing circuit 73 from timing pulses TIM applied at a terminal 70, and continue to count until the next reset pulse arrives, the length of the counting period being predetermined so as to correspond to a number 2N (or 2N+1), where N is a positive integer. The count contents of the mark-ratio counters 71 and 72 are read out by a read pulse RD immediately before resetting. The information important to this invention is whether the "mark-ratio" exceeds one-half or not, which information can be represented, as will easily be understood, by the most significant digits (MSD) of the counters 71 and 72 at the read-out time point if these counters are of a binary type. It follows that, if the count for mark exceeds N, i.e., the "-mark-ratio" exceeds one-half, the "true" output (C 1 for counter 72 and C 2 for counter 72) of MSD at the read-out time point will be a "mark" whereas the "-complementary" output $\overline{C1}$ or $\overline{C2}$ is a "space". Conversely, if the mark-ratio is smaller than one-half, the true and complementary outputs will be "space" and "-mark", respectively. Which of the outputs that is, the true or complementary output, should be read out from the mark-ratio counters will become clear from a later portion of this description.

Figure 4:
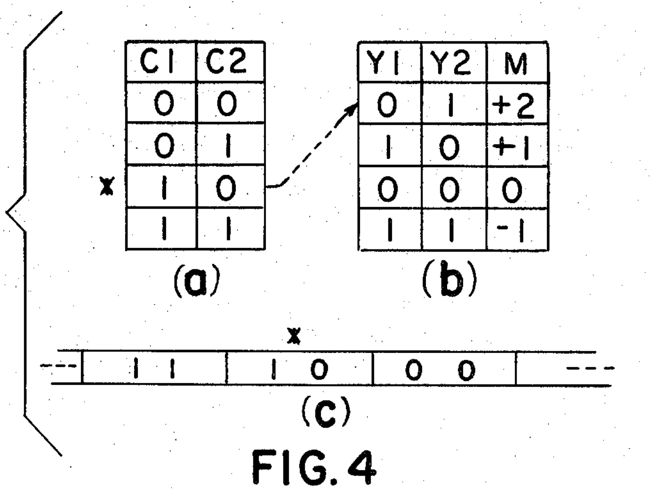
FIG. 4 (*c*) illustrates the code combination of the mark-ratio counters of the embodiment of FIG. 3.
Figure 5:
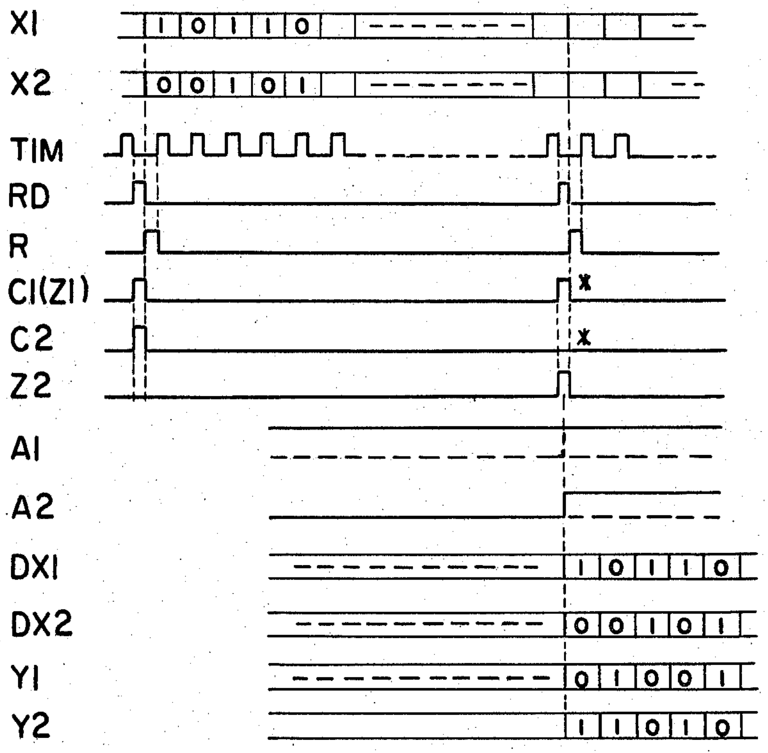
FIG. 5 illustrates the waveforms of the signals employed in the circuit of FIG. 3.

FIG. 5 illustrates the waveforms and the phase relationships of the signals X1, X2, TIM, RD, R, C1 and C2, and FIG. 4(c) illustrates the transition of the combination of the true outputs C1 and C2 of MSD's at the read-out time point. Referring now to that period which is marked by the asterisk * in FIG. 4(*c*), it is seen that output C1 is "1" (=mark) and output C2 is "0" (=space), which also corresponds to the *-marked portions of the waveforms of outputs C1 and C2 in FIG. 5.

There are four possible combinations of outputs C1 and C2, as shown in FIG. 4(*a*), and the values of outputs C1 and C2 for that period which has just been counted are assumed to be 1 and 0, respectively, as pointed out by the asterisk *. On the other hand, FIG. 4(*b*) shows an example of the input-output relationship for the two-level to multilevel code converter of FIG. 1, in which the two-level inputs are represented by Y1 and Y2, and the multilevel output is represented by M. More specifically, the maximum level "+2" of the multilevel output occurs when the combination of inputs Y1 and Y2 is "0 1," level "+1" when that input combination is "10", level "0" when the combination is "00", and level "−1" when the combination is "11". (This combination is offered as a mere example, since any other combination is also possible.) It follows that, for this two-level to multilevel converter, the more "0' s" (=spaces) that occur for input Y1 and the more "1' s" (=marks) that occur for input Y2, the higher will be the occurrence frequency of the maximum amplitude level "+2".

For the count period of the present case, however, the combination of outputs C1 and C2 is "10," that is, the mark-ratio for signal X1 exceeds one-half while that for signal X2 is below one half. Therefore, in order to make the frequency of the maximum amplitude level "+2" of the multilevel output higher than those of any other levels by some intermediate code conversion between X1, X2 and Y1, Y2, it is seen that the mere code inversion, i.e., the exchange of a "mark" and a "-space", of the code trains of both signals X1 and X2 will suffice for the current period marked with the asterisk *. Further examination will reveal that such inputs Y1 and Y2 can be obtained by an exclusive-OR of signals C1 and X1 and that of signals $\overline{C2}$ and X2, respectively, where $\overline{C2}$ is the complementary of output C2.

From the foregoing, the problem of which of the outputs that is the truth or complement, of MSD's the of counters 71 and 72 should be read out can be resolved. That is, the true (or complementary) output of MSD of the counter corresponding to "0" (or "1") in the combination "Y1, Y2" for the maximum level should be read out. According to FIG. 4(*b*) this combination is given by "01", so that the true output $c_1$ of the counter 71 and the complementary output $\overline{C2}$ of the counter 72 should be read out in the present case. The information read out in this manner will be referred to as inversion information signals Z1 and Z2. So long as the two-level to multilevel code conversion table of FIG. 4(*b*) is employed, the relations Z1=C1 and Z2=$\overline{C2}$ always hold true, and are respectively reading-out by read-out circuits 74 and 75 (FIG. 3) on the occurrence of the read pulse RD generated by the timing circuit 73. More particularly, reading-out circuit 74 can be realized by an AND circuit of the true output $C_1$ and the read pulse RD, and the reading-out circuit 75 by an AND gate of the complementary output $C_2$ and the read pulse RD.

The outputs from read-out circuits 74 and 75 are respectively available at output terminals Z1 and Z2 as important information for decoding, and are also respectively sent to holding circuits 76 and 77 to be held for a period of 2N (or 2N+1) digits. These holding circuits are binary storage circuits which may include flip-flops. The outputs of holding circuits 76 and 77 are shown by A1 and A2, respectively, in FIG. 5. The information carried by waveforms A1 and A2 is related to input signals X1 and X2 that have occurred in the previous period. It follows that signals X1 and X2 must be delayed by a period of approximately 2N (or 2N+1) digits in order to draw the proper result from the exclusive-OR operation described above. Delay circuits 78 and 79 in FIG. 3 are provided for this purpose. The outputs of the delay circuits 78 and 79 are applied to exclusive-OR circuits 80 and 81, respectively, to which the outputs of holding circuits 76 and 77 are also applied, and are properly inverted to be available at output terminals Y1 and Y2. The waveforms at these output terminals are shown by Y1 and Y2 in FIG. 5.

Whereas the case of $n$=2 has been hereinabove described for the sake of simplicity, the principles of the invention are the same with $n$ larger than 2, only that a proper number of unit functions each consisting of $n$ circuits shown by numerals 71, 74, 76, 78 and 80 of FIG. 3 must be added in parallel. Which of the outputs, the true or the complement should be selected by the read-out circuit in each of such unit functions can be determined, by expanding the foregoing theory.

In FIG. 2 terminals 1 and 61 are respectively associated with terminal 41, terminals 2 and 62 with terminal 42, . . . , and $n$ and 6$n$ with terminal 4$n$, just as terminals Y1 and Z1 are associated with input X1 and terminals Y2 and Z2 with input X2, in FIG. 3. Terminal 40 in FIG. 2 corresponds to the terminal 70 in FIG. 3, through which timing pulses required in the operation of code conversion circuit 50 are supplied.

As mentioned above, the converted outputs of conversion circuit 50 are applied to two-level to multilevel code converter 51 and formed into a multilevel code signal appearing at the output terminal 32 of FIG. 2.

Although it is beyond the scope of the present invention, it will be helpful in understanding the present invention to consider how the multilevel information M obtained at output terminal 32 and the inversion information Z provided at terminals 61 through 6n of FIG. 2 are transmitted. One approach is to use separate transmission media for the multilevel information M and for the inversion information Z. Another approach is to use only one transmission medium, wherein two types of information must be multiplexed in some way, for example, by using any well-known multiplexing technique such as frequency division multiplex or time division multiplex technique.

Finally, a decoding operation will be briefly described, if a set of multilevel information M and inversion information Z were, by some means, transmitted to a receiver in which the multilevel information M is decoded into a train of two-level codes by a multilevel to two-level code converter, the original train of $n$ two-level codes can readily be reproduced by means of the inversion information Z. More specifically, if an inversion information Z is a "mark" the decoded two-level codes associated with it are further inverted. If an inversion information Z is a "space" the decoded two-level codes directly become the original two-level codes. This is the same exclusive-OR operation as has been employed in the circuit of this invention. It can thus be seen that a circuit similar to that of this invention may be provided in the receiver side. No further explanations is believed necessary in this connection.

As described above, by the use of the code conversion circuit of this invention the occurrence frequency of a particular code with a particular level (the maximum level having been adopted in the above description) among the multilevel code outputs from a given two-level to multilevel code converter can be kept high, thereby providing a multilevel code signal that is most desirable for multilevel code transmission.

What is claimed is:

1. A code conversion circuit for a two-level to multilevel code conversion apparatus wherein $n$ two-level code inputs ($n$ being a positive integer) are converted to multilevel code outputs whose number of levels is equal to or greater than $2^n$, comprising first conversion means for converting said $n$ two-level code inputs to intermediate $n$ two-level code signals including $n$ mark-ratio counters for respectively examining the mark-ratio of each of said $n$ two-level code inputs in a predetermined time period, $n$ read-out circuits for respectively reading out selectively predetermined ones of the true and complementary outputs of the most significant digits of said mark-ratio counters, $n$ holding circuits for respectively holding the output of said read-out circuits during said predetermined time period, $n$ delay circuits for delaying said two-level code inputs by said predetermined time period, $n$ exclusive-OR circuits for respectively producing a logical discoincidence output between each output of said delay circuits and each output of the associated one of said holding circuits, and a timing circuit for supplying timing pulses to said read-out circuits and said holding circuits; and second means for converting said intermediate $n$ two-level code signals to said multilevel code outputs, whereby the occurrence frequency of a particular level of said multilevel code outputs is made highest among the levels of the multilevel code outputs by the selectively predetermined combination of said most significant digit outputs.

2. The circuit of claim 1, in which said particular level is the maximum level of said multilevel code outputs.

* * * * *